United States Patent [19]

Romero et al.

[11] Patent Number: 5,290,588
[45] Date of Patent: Mar. 1, 1994

[54] TIW BARRIER METAL PROCESS

[75] Inventors: Jeremias D. Romero, San Jose; Homi Fatemi, Los Altos Hills; Eugene A. Delenia, Gilroy; Muhib M. Khan, San Jose, all of Calif.

[73] Assignee: Advanced Micro Devices, Incorporated, Sunnyvale, Calif.

[21] Appl. No.: 812,244

[22] Filed: Dec. 19, 1991

[51] Int. Cl.⁵ ............................ B05D 5/12; B05D 3/02
[52] U.S. Cl. .................................... 427/123; 427/124;
427/318; 427/319; 427/404; 427/405; 437/190;
437/192; 437/194
[58] Field of Search ............... 427/123, 124, 404, 405,
427/318, 319; 437/190, 192, 194

[56] References Cited

U.S. PATENT DOCUMENTS

| | | | |
|---|---|---|---|
| 4,816,424 | 3/1989 | Watanabe et al. | 437/190 |
| 4,880,708 | 11/1989 | Sharma et al. | 428/620 |
| 4,981,816 | 1/1991 | Kim et al. | 437/189 |

OTHER PUBLICATIONS

Nowicki et al., "Studies of the Ti-W/Au metallization on aluminum", Thin Solid Films, 53 (1978) pp. 195-205.
Walters et al, "Properties of Reactive Sputtered TiW", Solid State Technology, pp. 131-136 (Feb. 1986).

Primary Examiner—Roy King
Attorney, Agent, or Firm—Benman & Collins

[57] ABSTRACT

An improved process is provided for forming a multi-layer structure (18) suitable for tape automated bonding thereto or for forming contacts. In the process, a first layer (12) of aluminum is formed on a substrate (10), a second layer (14) of a TiW alloy is formed on the first layer of aluminum, and a third layer (16) of gold is formed on the second layer of the TiW alloy, to which third layer of gold bonding is done. The improvement comprises annealing the second layer of the TiW alloy in an inert atmosphere at a temperature less than about 500° C. for a period of time sufficient to form a film of an Al—TiW phase (20), believed to comprise $TiAl_3$, at the interface between the first layer of aluminum and the second layer of the TiW alloy. The annealing is done prior to forming the third layer of gold on the second layer of the TiW alloy.

14 Claims, 4 Drawing Sheets

TIW BARRIER METAL PROCESS

TECHNICAL FIELD

The present invention relates generally to contacts to semiconductors, and, more particularly, to tape automated bonding (TAB) technology.

BACKGROUND ART

The current multilayer bond pad structure for tape automated bonding comprises three different metal layers: aluminum, titanium-tungsten alloy, and gold. The aluminum layer is formed on the semiconductor substrate. The gold layer is the seed film for a subsequent Au bump plating process. The TiW alloy is the intended barrier layer between Al and Au to prevent the formation of the well-known "purple plague". The thicknesses of the various layers are: Al - 10,000 Å, TiW - 3,000 Å, and Au - 2,000 Å. Typically, the ratio of Ti:W is about 10 at % Ti and 90 at % W.

At the present time, the sputter deposition of TiW and Au layers is done sequentially in one pumpdown to minimize contamination from the ambient. The problem observed with this multilayer structure is that the pure TiW layer, which served as a barrier layer, has been found to be ineffective, allowing Au and Al to intermix during a 450° C./30 sec inner-lead bond (ILB) TAB operation. This intermixing is generally not favorable due to the formation of Au—Al intermetallics which are brittle in nature and sometimes highly resistive. During a thermal cycle, stress would be generated at the Au, Al, and intermetallics interfaces which would likely lead to microcracks. Upon further cycling, these microcracks could propagate to weaken the metallization/bump interface and eventually lead to failure. In plastic packages, Au—Al intermetallics and void formation have been the major cause of voltage overload ($V_{OL}$) failures at high temperatures.

Interdiffusion problems in TAB structures similar to that described above are not new and have been described in the prior art by others. For example, R. S. Nowicki et al in *Thin Solid Films*, Vol. 53, pp.195-205 (1978) found that TiW used in an Al/TiW/Au metallization system exhibits marginal diffusion characteristics when deposited in a relatively pure state. They reported that an improvement was observed when TiW was sputtered in a gaseous mixture comprising nitrogen and argon. It appeared that optimum barrier properties were obtained when TiW was deposited in a relatively impure state, i.e., filled with nitride. However, gold does not stick well to a TiW-nitride surface.

It is desirable to have an effective barrier layer for tape automated bonding, to which gold will readily adhere.

DISCLOSURE OF INVENTION

In accordance with the invention, a process is provided for forming a TiW barrier layer. The process comprises forming the Al/TiW/Au layers as in the prior art. However, the inventive step involves annealing the Al/TiW structure in an inert atmosphere, prior to the Au deposition. The annealing is done at a temperature less than about 500° C., in order to form a stable Al—TiW phase, which is verified to be $TiAl_3$. This stable phase, which is at least about 300 Å thick, prevents interdiffusion between aluminum and gold.

The process of the invention may also be used to form Al/TiW contacts.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

BEST MODES FOR CARRYING OUT THE INVENTION

Reference is now made in detail to a specific embodiment of the present invention, which illustrates the best mode presently contemplated by the inventors for practicing the invention. Alternative embodiments are also briefly described as applicable.

Figure 1:
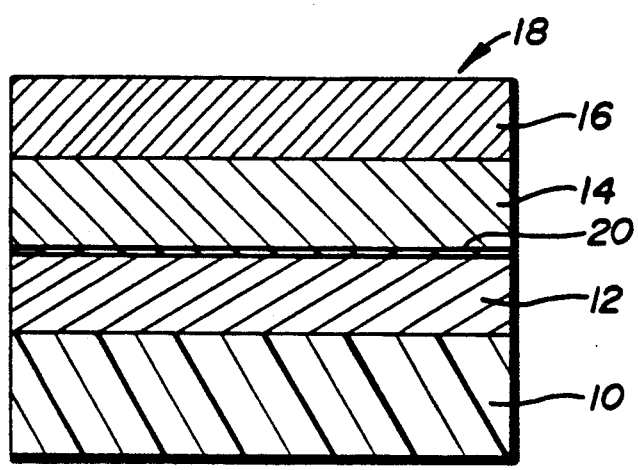
FIG. 1 is a cross-sectional view of the multi-layer structure for TAB technology.

The present multilayer bond pad structure for tape automated bonding, depicted in FIG. 1, consists of three different metal layers formed on a substrate 10. The first layer 12 consists essentially of aluminum, formed to a thickness of about 10,000 Å. As is well-known, the aluminum comprises an alloy of Al/1% Si/0.5% Cu. The second layer 14 consists essentially of TiW alloy, formed to a thickness of about 3,000 Å. The third, and final, layer 16 consists essentially of sputtered or evaporated gold, formed to a thickness of about 2,000 Å. The gold layer 16 is the seed film for the subsequent Au bump plating process and the TiW layer 14 is the intended barrier between Al and Au.

At the present time, the sputter deposition of Ti—W and Au layers is done sequentially in one pumpdown to minimize contamination. The problem observed with this multilayer structure 18 is that the pure TiW layer, which supposedly serves as a barrier layer, has been found to be ineffective, allowing Au and Al to intermix during an innerlead bond (ILB) TAB operation at 450° C. for 30 sec, leading to the problems described above.

In accordance with the invention, following the formation of the TiW layer 14 on the Al layer 12, the assembly is annealed in an inert atmosphere at a temperature of about 400° to 500° C. for a period of time sufficient to form a stable Al—TiW phase. Preferably, the annealing conditions range from about 400° and 450° C. for a period of time ranging from about 20 to 60 minutes, the lower times associated with the higher temperatures. Most preferably, the temperature of annealing is about 425° C. for at least about 30 minutes.

The inert atmosphere that is employed is selected from the group consisting of argon, nitrogen, helium, neon, and krypton.

The temperature and times are selected to provide a stable Al—TiW phase. This phase 20, which is verified to be $TiAl_3$, is formed at the interface between the Al and TiW layers 12 and 14, respectively. Apparently, a film thickness of only about 300 to 400 Å of this phase is sufficient to prevent interdiffusion, since any further diffusion of Al into the TiW layer 14 is trapped in the Al—TiW phase, which is more stable than Al itself.

However, less than about 300 Å of the Al—TiW phase 20 permits the formation of the "purple plague" when the Au layer 16 is deposited on the TiW layer 14 and the assembly is heated to 450° C. for 30 min. Thus, this provides an indication if an insufficient amount of this phase is formed.

Alternatively, Auger profile of the various layers may be done to determine the composition of the layers and the formation of the desired phase 20. By a series of temperature and time annealing studies in a given atmosphere, the particular conditions may be determined for the optimum formation of the Al—TiW phase 20.

The process of the invention may also be employed for forming contacts comprising a two-layer structure of aluminum 12 and TiW 14.

The composition of the Al—TiW phase (or phases) that are formed under the conditions described above is believed to comprise $TiAl_3$, as described in greater detail below. The stable Al—TiW phase is formed at a thickness sufficient to prevent interdiffusion of Au and Al. As stated above, this thickness is at least about 300 Å.

The use of any of the inert gases, such as argon, helium, neon, or krypton, or mixtures thereof, has no adverse effect on the process, and the annealing may be done in any or a mixture of these gases so long as oxygen is excluded from the annealing process, since gold will not adhere or wet onto TiW oxides.

In the case of nitrogen, this gas (or mixtures of this gas with any of the other inert gases) may be used not only if oxygen is excluded during annealing, but also if the vacuum is broken prior to annealing to permit the formation of a thin oxide layer ($\approx 50$ Å) on the TiW layer. This thin oxide layer is formed from oxygen in the air and prevents the formation of nitrides during the annealing process.

EXAMPLES

Annealing of the pure TiW layer 14 (formed on an Al layer 12, in turn formed on the surface of a polysilicon or silicon oxide or Ti or TiN substrate 10) was done prior to Au deposition at 425° C. in a diffusion furnace and was varied by varying the heat treatment time between 15 and 20 minutes and the ambient gas from pure Ar to 20% $N_2$ in Ar. The nitrogen concentration in the gas was varied to determine the formation of TiW nitride and its effects on the integrity of the barrier.

The gold layer 16 was then deposited after the anneal and the integrity of the various barriers was tested by subjecting the samples to thermal cycles between 25° and 500° C. Two cycles were done with one hour hold at 500° C. during this cycling sequence. The criteria of an effective barrier was for it to be able to prevent Al from diffusing through and into the Au layer. ESCA analysis was used to determine the presence of Al on the Au surface and its subsurface (30 Å depth).

The results of the tests are summarized in Table I, below.

TABLE I

| TiW Anneal Matrix and Surface Analysis. | | |
|---|---|---|
| Ambient Gas During Anneal | Anneal Time at 425° C. | Presence of Al on Au Surface? |
| Pure Ar | 30 min | no |
| 5% $N_2$/Ar | 15 min | yes |
| 20% $N_2$/Ar | 15 min | yes |
| 5% $N_2$/Ar | 30 min | no |
| 10% $N_2$/Ar | 30 min | no |
| 20% $N_2$/Ar | 30 min | no |

All of the samples annealed at 425° C. for 15 minutes, regardless of the ambient gas used, were found to contain Al on the gold surface, and thus rendered to be ineffective barrier layers. On the other hand, all of the samples annealed at the same temperature for 30 minutes, regardless of the ambient gas used, were found to have no Al on the Au surface, and thus had effective barrier layers. It would seem that the important factor in creating an effective barrier was the time of anneal where a minimum of 30 minutes at 425° C. was required. Also, because the sample annealed in pure Ar for 30 minutes seemed to show excellent barrier characteristics, the formation of any TiW nitrides does not seem to be important in creating an effective barrier layer. That is, $TiAl_3$ and TiN can occur, but $TiAl_3$ will dominate and therefore, TiN formation would not seem to be substantial, since Ti is consumed mostly in the $TiAl_3$ phase.

Visually, the surface of the samples on which the presence of Al was detected appeared purple (from the color of an oxide associated with aluminum), but under optical microscopic examination, microstructures of "worm-like" appearance were observed across the surface of these wafers. These microstructures manifested from the formation of Au-Al intermetallics, which was confirmed by ESCA depth profile analysis. The microstructures exhibited significant topography which could promote surface roughness and poor adhesion.

The thermal cycle test was done in a furnace purged with $N_2$, in order to minimize oxidation. Since it could be assumed that oxygen from air might act as the driving force for the diffusion of aluminum toward the surface to form $Al_2O_3$, the thermal test was repeated in air by static baking at 450° C. for 2 hours.

The samples annealed in 5% $N_2$—Ar and 20% $N_2$—Ar at 425° C./15 min, which had previously failed during thermal cycling tests in nitrogen ambient, showed even worse results in the air ambient bake. The samples with TiW annealed at 425° C. for 30 minutes which did not fail in the $N_2$ cycling test, had different results in the air bake. The samples with the Al/TiW annealed in 5% $N_2$—Ar and 20% $N_2$—Ar at 425° C./30 min failed, while those annealed in pure Ar and 10% $N_2$—Ar at 425° C./30 min did not.

These results were inconsistent with those obtained from the $N_2$ thermal cycling test. It would seem that the thermal bake in air was harsher than the thermal cycle performed in $N_2$, and that the presence of oxygen accelerated the $Al_2O_3$ and the intermetallic microstructure formation. From the two thermal tests performed, one can conclude that Al/TiW annealed at 425° C. for 15 minutes in either pure Ar or $N_2$—Ar ambient was not sufficient to create an effective barrier. On the other hand, annealing at 425° C. for 30 minutes seemed to produce better results. The increasing concentration of nitrogen in the N$_2$—Ar mixture did not seem to increase the effectiveness of the barrier produced. This was observed in the air bake tests where the sample annealed in 10% N$_2$—Ar/425° C./30 min produced better results than the sample annealed in 20% N$_2$—Ar/425° C./30 min. Also, because the sample which was annealed in pure Ar for 30 minutes performed just as well as the sample annealed in 10% N$_2$—Ar, the effect of nitrogen, and therefore, the formation of TiN may not have occurred appreciably in the TiW layer. Therefore, the dominant barrier layer could result from the formation of TiAl$_3$ at the Al/TiW interface.

To obtain a better understanding of the mechanisms involved in creating an effective barrier, ESCA depth profile analysis of samples which had undergone thermal cycle test were performed. These samples were: Al/TiW/Au with the Al/TiW annealed at 425° C./30 min/pure Ar and Al/TiW/Au with the Al/TiW annealed at 425°/30 min/10% N$_2$—Ar. They were chosen simply because they did not show any Al—Au interaction as verified by optical inspection.

Figure 2:
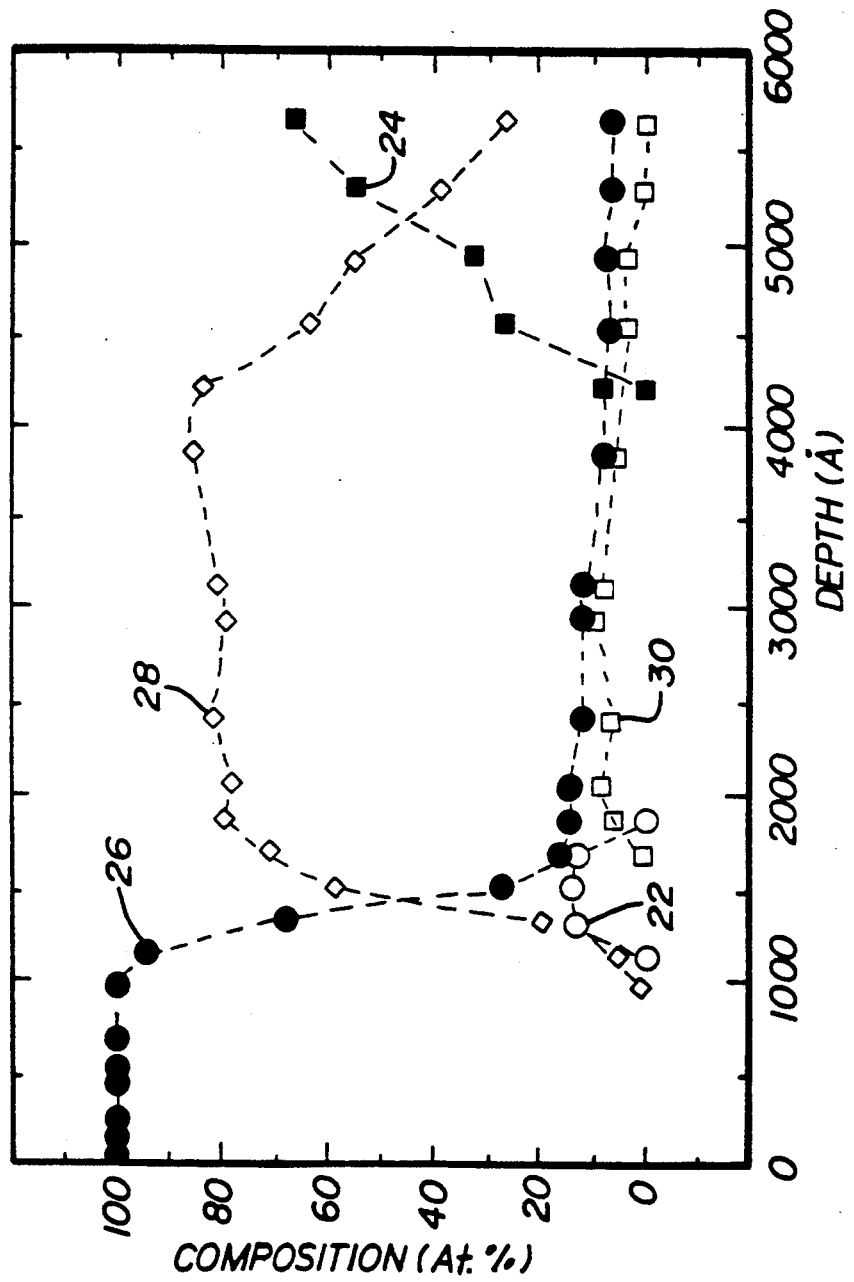
FIG. 2, on coordinates of composition (in at %) and depth (in Å), is an ESCA (electron spectroscopy for chemical analysis) depth profile of thermally cycled Al/TiW/Au sample with TiW annealed at 425° C. for 30 minutes in pure argon.

The ESCA depth profile of the sample with the Al/TiW annealed at 425° C./30 min/pure Ar is illustrated in FIG. 2. Curve 22 represents oxygen, Curve 24 represent aluminum, Curve 26 represents gold, Curve 28 represents tungsten, and Curve 30 represents titanium.

In this sample, except for slight diffusion of Au through the TiW layer and into the Al layer, the three layers remained intact with little interdiffusion. Al and TiW interdiffused to a degree as seen from the overlapping traces of Ti and Al, and formed a mixture of Al—TiW at the Al/TiW interface. This mixture is a stable phase known to be TiAl$_3$ which forms at approximately 400° C. [see, e.g., R. A. M. Walters et al, "Properties of Reactive Sputtered TiW", Solid State Technology, pp. 131-136 (February 1986 )]. Further, from ESCA, one can quantitatively determine the chemical bonding and therefore determine the TiAl$_3$ phase.

Upon formation, further interaction between Al and Ti was retarded, which prevented Al from further diffusing and intermixing with the gold layer. The pure TiW did not act as an absolute barrier in this case, but was partly consumed by the Al layer during the anneal to form an effective sacrificial barrier layer at the interface 20.

A few monolayers of oxygen were observed at the TiW/Au interface. This was from the oxidation of w in the TiW matrix, which was formed during exposure to air between metallization deposition sequence. The presence of oxygen as an impurity could further enhance barrier stability, but can cause poor adhesion, especially if it were substantially thick ($>$100 Å).

Figure 3:
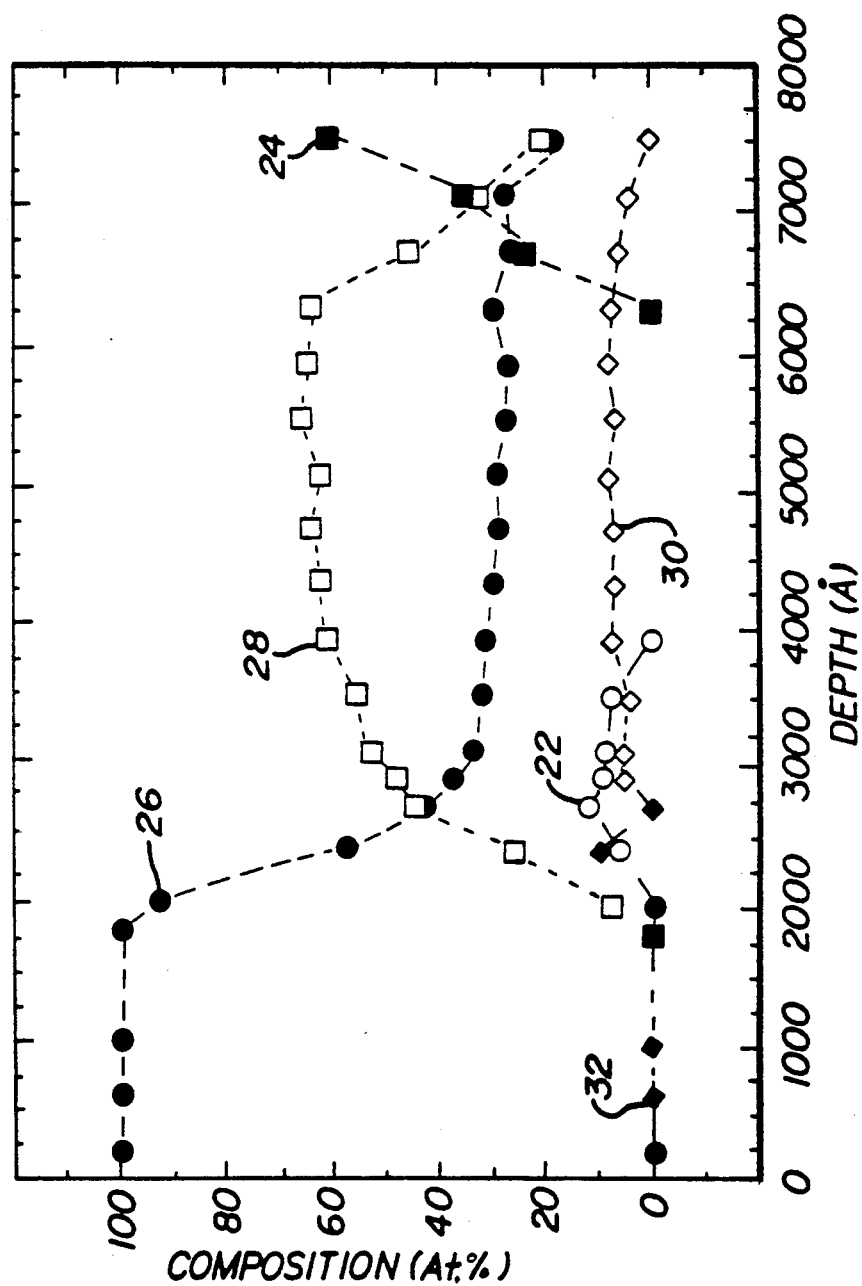
FIG. 3 is a plot similar to FIG. 2, but in an atmosphere of 10% $N_2$ and argon.

The ESCA depth profile of the sample with the Al/TiW annealed in 10% N$_2$—Ar for 30 minutes prior to Au deposition is depicted in FIG. 3; the numeral designations for the curves are the same as for FIG. 2. Curve 32 represents carbon.

This sample exhibits the same interdiffusion between Al and TiW, giving rise to the formation of the TiAl$_3$ layer. The presence of nitrogen or TiN at the TiW/Au interface was not detected, and hence the formation of TiW-nitride during the Al/TiW anneal in nitrogen seemed not to occur. Therefore, it may be concluded that the only mechanism which makes the barrier effective is the formation of TiAl$_3$, under the given anneal conditions.

The formation of stable phases among Ti, W, N, and Al and the effect of these phases on interconnect sheet resistance is now considered. A methodology for calculating simplified quaternary phase diagrams from thermodynamic data is known in the art. Essentially, an isothermal, isobaric quaternary phase diagram is represented in a regular tetrahedron, the four corners of which represent the four pure elements. Binary, ternary, and quaternary compositions are represented on (in) the edges, faces, and interior, respectively, of the tetrahedron. Two-, three-, and four-phase mixtures of immiscible components are represented by tie-lines, tie-planes, and tie-tetrahedra, respectively. At constant arbitrary temperature and pressure, the Gibbs phase rule predicts a maximum of four phases in simultaneous equilibrium for a four-component system. Accordingly, a tie-line cannot cross a tie-plane in a quaternary phase diagram. By computing the change in Gibbs free energy for the balanced reaction involving two reactants and three products (representing a competing tie-line and tie-plane, respectively), one decides which compounds are in thermodynamic equilibrium. A negative change in the Gibbs free energy would imply the products—the tie-plane in this case—to be stable. In order to determine the complete quaternary phase diagram, all possible combinations of reactants and products must be considered.

It is important to note that phases which are mutually stable, and so will not react with one another upon heating, are connected by tie-lines in the phase diagram. When this is not the case, the reaction products are given by the four-phase-tie-tetrahedron representing the composition region most appropriate to the interface under consideration.

Figure 4:
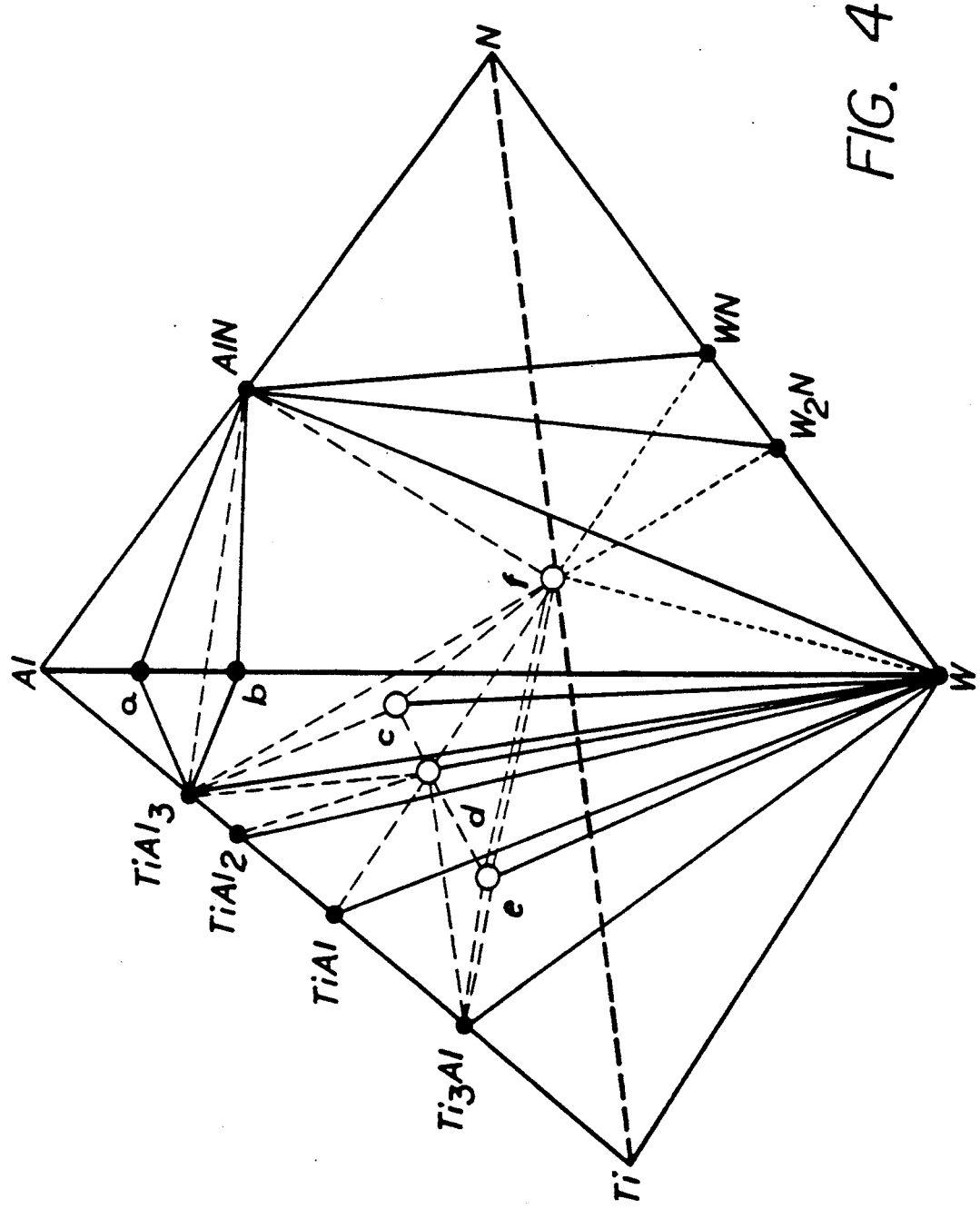
FIG. 4 is a quaternary phase diagram of the Ti—Al—W—N system at 900° K. (627° C.)

The four ternary combinations can be calculated first, and their phase diagrams are represented on the faces of the Ti—W—Al—N quaternary tetrahedron, as shown in FIG. 4. In this Figure, the thick dashed lines are the interior (quaternary) tie-lines, a=WAl$_{12}$, b=WAl$_5$, c=Ti$_3$Al$_2$N$_2$, d=Ti$_2$AlN, e=Ti$_3$AlN, and f=TiN.

Tie-lines emanate from W to the titanium aluminides, and form TiAl$_3$ to the tungsten aluminides. The absence of a tie-line from Al to all TiW compositions in the Ti—W—Al phase diagram implies that a pseudo-alloy of TiW of any composition will react with Al. Aluminum-rich aluminides of titanium and tungsten are observed to form. In the Al—Ti—N phase diagram, tie-lines exist between TiN and AlN, TiAl$_3$, Ti$_3$Al, and the ternary titanium aluminum nitrides. The absence of a tie-line between Al and TiN indicates that Al will react with TiN to form TiAl$_3$ and AlN.

Since the tie-lines emanate from AlN to tungsten, and to the tungsten nitrides and aluminides, AlN is the most dominant phase in the Al—W—N ternary system. Once again, the absence of a tie-line between Al and the tungsten nitrides implies that these phases will react to form AlN, WAl$_{12}$, and/or WAl$_5$.

Interior tie-lines exist between tungsten and the titanium aluminum nitrides in the complete Ti—W—N—Al phase diagram. Tie-planes connect the tungsten aluminides to TiAl$_3$ and AlN, indicating three-phase equilibrium. Absence of a tie-line from Al to all ternary-composition TiW-nitrides implies that Al cannot be stable with a ternary TiW-nitride and would react to form AlN, a tungsten aluminide, and TiAl$_3$. Additionally, of the latter three phases (i.e., the reaction products), only AlN is stable with TiW nitride. This implies that of the three reaction products, AlN is likely to form adjacent to the TiW nitride. However, it is very crucial to notice that AlN formation can only happen above 500° C., and as long as the TAB pad structure is not exposed to temperatures greater than 500° C., then TiAl$_3$ is the most stable structure that would prevent Al—Au interdiffusion reaction.

Figure 5:
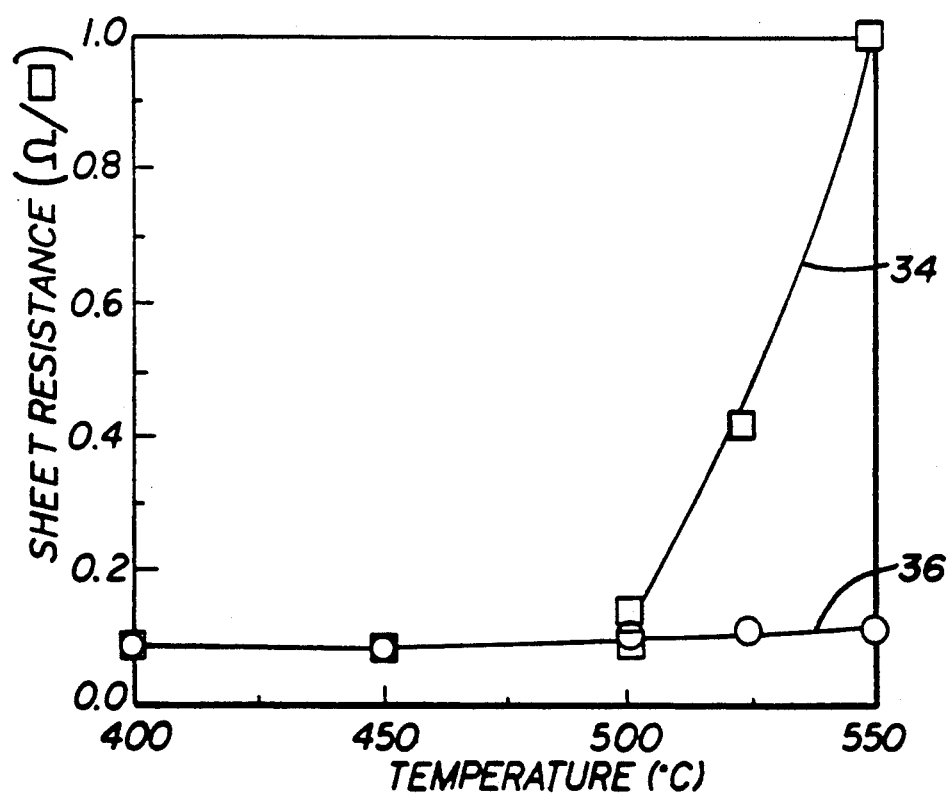
FIG. 5, on coordinates of sheet resistance (in ohm/square) and temperature (in °C.), is a plot of the sheet resistance of Al/TiW and Al/TiW-nitride films as a function of annealing temperature.

Upon annealing Al/TiW and Al/TiW-nitride thin films, a reaction occurs at the interface of the Al/TiW(-nitride) layers. The sheet resistance measurements of the Al/TiW-(nitride) films at different annealing temperatures are shown in FIG. 5. Curve 34 represents Al/TiW, while Curve 36 represents Al/TiW-nitride.

Once again, the data imply that the reaction is more extensive in the case of pure TiW films than it is in the case of the nitrided ones. The sheet resistance increases by an order of magnitude at 550° C. in the case of the former, whereas it is not even two-fold for the latter. This can be attributed to the presence of an interfacial AlN layer, in the case of the nitrided TiW films, which kinetically restricts the reaction of Al with TiW-nitride. AlN is stable with Al, TiW-nitride, TiAl$_3$, WAl$_5$, and WAl$_{12}$, and thus will not decompose any of these. However, from FIG. 5, it should be noted that sheet resistance would stay flat at T≦500° C. with both Al/TiW and Al/TiW-nitride. (In FIG. 5, rapid thermal annealing was employed below 500° C., while furnace annealing was employed at 500° C. and above.) Therefore, the TiAl$_3$ layer in the Al/TiW structure can act as a diffusion barrier between Al and Au, and not cause any increase in sheet resistance of the interconnect as long as the subsequent thermal cycles do not exceed 500° C.

INDUSTRIAL APPLICABILITY

The process of the invention is expected to find use in modifying the present multilayer metallization used in TAB pad technology to reduce the possibility of interdiffusion of aluminum and gold.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for forming a multi-layer structure, wherein a first layer of aluminum is formed on a substrate and a second layer consisting essentially of a TiW alloy is formed on said first layer of aluminum to form a layered structure, the improvement comprising (a) annealing said layered structure in an inert atmosphere at a temperature ranging from about 400° to 500° C. for a period of time sufficient to form a film of an Al—TiW phase at the interface between said first layer of aluminum and said second layer of said TiW alloy, said film of said Al—TiW phase having a thickness of at least about 300 Å, and (b) forming a gold layer on said TiW layer following said annealing of said layered structure.

2. The process of claim 1 wherein said temperature ranges from about 400° to 450° C.

3. The process of claim 2 wherein said period of time ranges from about 20 to 60 minutes, with said annealing done for shorter periods of time at higher temperatures or for longer periods of time at lower temperatures.

4. The process of claim 3 wherein said temperature is about 425° C. and said period of time is at least about 30 minutes.

5. The process of claim 1 wherein said inert atmosphere consists essentially of at least one gas selected from the group consisting of argon, nitrogen, helium, neon, and krypton.

6. The process of claim 5 wherein said inert atmosphere consists essentially of at least one gas selected from the group consisting of argon and nitrogen.

7. The process of claim 1 wherein said Al—TiW phase consists essentially of TiAl$_3$.

8. A process for forming a multi-layer structure suitable for tape automated bonding thereto, wherein a first layer of aluminum is formed on a substrate, a second layer consisting essentially of a TiW alloy is formed on said first layer of aluminum to form a layered structure, and a third layer of gold is formed on said second layer of said TiW alloy, to which third layer of gold bonding is done, the improvement comprising annealing said layered structure in an inert atmosphere at a temperature ranging from about 400° to 500° C. for a period of time sufficient to form a film of an Al—TiW phase at the interface between said first layer of aluminum and said second layer of said TiW alloy, said film of said Al—TiW phase having a thickness of at least about 300 Å, said annealing done prior to forming said third layer of gold on said second layer of said TiW alloy.

9. The process of claim 8 wherein said temperature ranges from about 400° to 450° C.

10. The process of claim 9 wherein said period of time ranges from about 20 to 60 minutes, with said annealing done for shorter periods of time at higher temperatures or for longer periods of time at lower temperatures.

11. The process of claim 10 wherein said temperature is about 425° C. and said period of time is at least about 30 minutes.

12. The process of claim 8 wherein said inert atmosphere consists essentially of at least one gas selected from the group consisting of argon, nitrogen, helium, neon, and krypton.

13. The process of claim 12 wherein said inert atmosphere consists essentially of at least one gas selected from the group consisting of argon and nitrogen.

14. The process of claim 8 wherein said Al—TiW phase consists essentially of TiAl$_3$.

* * * * *